United States Patent
Jang et al.

(10) Patent No.: US 6,239,002 B1
(45) Date of Patent: May 29, 2001

(54) THERMAL OXIDIZING METHOD FOR FORMING WITH ATTENUATED SURFACE SENSITIVITY OZONE-TEOS SILICON OXIDE DIELECTRIC LAYER UPON A THERMALLY OXIDIZED SILICON SUBSTRATE LAYER

(75) Inventors: Syun-Ming Jang, Hsin-Chu; Ying-Ho Chen, Taipei; Chen-Hua Yu, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/174,660

(22) Filed: Oct. 19, 1998

(51) Int. Cl.$^7$ .................................................. H01L 21/76
(52) U.S. Cl. ..................... 438/435; 438/424; 438/427
(58) Field of Search .................... 438/207, 424, 438/425, 426, 427, 435, 436, 437, 439, 452

(56) References Cited

U.S. PATENT DOCUMENTS

| | | | |
|---|---|---|---|
| 4,729,006 | * 3/1988 | Dally et al. ........................... | 257/372 |
| 4,851,370 | * 7/1989 | Doklan et al. ....................... | 438/760 |
| 4,900,692 | * 2/1990 | Robinson ............................. | 438/421 |
| 5,294,571 | * 3/1994 | Fujishiro et al. .................... | 438/770 |
| 5,316,965 | 5/1994 | Philipossian et al. ............... | 438/424 |
| 5,492,858 | 2/1996 | Bose et al. ........................... | 438/437 |
| 5,516,721 | * 5/1996 | Galli et al. ........................... | 438/424 |
| 5,641,704 | 6/1997 | Paoli et al. ........................... | 438/436 |
| 5,665,635 | 9/1997 | Kwon et al. ......................... | 438/427 |
| 5,691,232 | * 11/1997 | Bashir et al. ........................ | 438/424 |
| 5,702,977 | 12/1997 | Jang et al. ........................... | 438/427 |
| 5,786,262 | * 7/1998 | Jang et al. ........................... | 438/424 |
| 5,885,883 | * 3/1999 | Park et al. ........................... | 438/435 |
| 5,918,125 | * 6/1999 | Guo et al. ............................ | 438/264 |
| 5,963,819 | * 10/1999 | Lan ...................................... | 438/424 |
| 6,066,543 | * 5/2000 | Takahashi et al. .................. | 438/424 |

FOREIGN PATENT DOCUMENTS 0 412 644 A2 * 2/1991 (EP) .

* cited by examiner

Primary Examiner—Carl Whitehead, Jr.
Assistant Examiner—Jeff Vockrodt
(74) Attorney, Agent, or Firm—George O. Saile; Stephen B. Acker; Stephen G. Stan

(57) ABSTRACT

A method for forming a trench isolation region within a trench within a silicon substrate. There is first provided a silicon substrate having a trench formed therein. There is then formed over the silicon substrate and filling the trench a silicon oxide trench fill layer. There is then thermally oxidized the silicon substrate and the silicon oxide trench fill layer within a thermal oxidation atmosphere to form a densified silicon oxide trench fill layer upon a silicon oxide trench liner layer within an oxidized trench within an oxidized silicon substrate, where the silicon oxide trench liner layer is formed from oxidation of the silicon substrate when forming the oxidized silicon substrate.

27 Claims, 1 Drawing Sheet

THERMAL OXIDIZING METHOD FOR FORMING WITH ATTENUATED SURFACE SENSITIVITY OZONE-TEOS SILICON OXIDE DIELECTRIC LAYER UPON A THERMALLY OXIDIZED SILICON SUBSTRATE LAYER

BACKGROUND OF THE INVENTION

1. Field of the Invention

The present invention relates generally to ozone-TEOS thermal chemical vapor deposition (CVD) methods for forming within microelectronics fabrications silicon oxide dielectric layers. More particularly, the present invention relates to ozone-TEOS thermal chemical vapor deposition (CVD) methods for forming within microelectronics fabrications silicon oxide dielectric layers formed with attenuated surface sensitivity with respect to thermal silicon oxide substrate layers.

2. Description of the Related Art

Integrated circuit microelectronics fabrications are formed from semiconductor substrates within and upon which are formed integrated circuit devices. The integrated circuit devices are connected internally and externally to the semiconductor substrates upon which they are formed through patterned integrated circuit conductor layers which are separated by integrated circuit dielectric layers.

As integrated circuit microelectronics fabrication integration levels have increased and integrated circuit device and patterned conductor layer dimensions have decreased, it has become more prevalent in the art of integrated circuit microelectronics fabrication to employ trench isolation methods, such as but not limited to shallow trench isolation (STI) methods and recessed oxide isolation (ROI) methods, to form trench isolation regions within a semiconductor substrate in order to separate active regions of the semiconductor substrate within and upon which are formed integrated circuit devices.

Such shallow trench isolation (STI) methods and recessed oxide isolation (ROI) methods are desirable within integrated circuit microelectronics fabrications since shallow trench isolation (STI) methods and recessed oxide isolation (ROI) methods provide trench isolation regions which are nominally co-planar with a surface of an adjoining active region of a semiconductor substrate. Such nominally co-planar trench isolation regions and adjoining active regions of a semiconductor substrate generally optimize an attenuated depth of focus typically achievable with an advanced photoexposure apparatus employed when forming advanced integrated circuit microelectronics devices and advanced patterned conductor layers within an advanced integrated circuit microelectronics fabrication.

While shallow trench isolation (STI) methods and recessed oxide isolation (ROI) methods are thus desirable when forming trench isolation regions within advanced integrated circuit microelectronics fabrications, shallow trench isolation (STI) methods and recessed oxide isolation (ROI) methods are nonetheless not entirely without problems within advanced integrated circuit microelectronics fabrications. In particular, it is often difficult to form when employing shallow trench isolation (STI) methods within integrated circuit microelectronics fabrications shallow trench isolation (STI) regions which simultaneously possess superior gap filling properties, superior bulk physical properties and enhanced deposition rates which in the aggregate provide shallow trench isolation regions with optimal properties within advanced integrated circuit microelectronics fabrications.

Of the dielectric layer deposition methods potentially applicable for forming shallow trench isolation regions when employing shallow trench isolation (STI) methods within integrated circuit microelectronics fabrications, atmospheric pressure thermal chemical vapor deposition (APCVD) methods and sub-atmospheric pressure thermal chemical vapor deposition (SACVD) methods employing ozone as an oxidant source material and tetraethylorthosilicate (TEOS) as a silicon source material (hereinafter, in general, "ozone-TEOS thermal chemical vapor deposition (CVD) methods") are particularly desirable due to the superior gap tiling properties of shallow trench isolation regions formed employing those ozone-TEOS thermal chemical vapor deposition (CVD) methods. Such ozone-TEOS thermal chemical vapor deposition (CVD) methods typically preclude plasma activation due to the increased reactor chamber pressures at which they are undertaken. While ozone-TEOS thermal chemical vapor deposition (CVD) methods do typically provide shallow trench isolation regions formed with superior gap filling properties, ozone-TEOS therm chemical vapor deposition (CVD) methods typically nonetheless also typically provide shallow trench isolation regions with inferior bulk properties (as typically evidenced by increased aqueous hydrofluoric acid etch rate) and with attenuated deposition rates upon thermal silicon oxide trench liner layers formed through thermal oxidation of silicon semiconductor substrates within which are formed those shallow trench isolation regions employing those ozone-TEOS thermal chemical vapor deposition (CVD) methods.

It is thus towards the goal of forming within integrated circuit microelectronics fabrications shallow trench isolation regions while employing ozone-TEOS thermal chemical vapor deposition (CVD) methods to provide shallow trench isolation regions simultaneously possessing: (1) enhanced gap filling properties; (2) enhanced bulk properties, such as but not limited to aqueous hydrofluoric acid wet chemical etch rate; and (3) attenuated surface sensitivity of the shallow trench isolation regions when formed upon thermal silicon oxide trench liner layers formed through thermal oxidation of silicon semiconductor substrates, that the present invention is more specifically directed. In a more general sense, the present invention is directed towards forming within microelectronics fabrications which are not necessarily integrated circuit microelectronics fabrications silicon oxide dielectric layers formed employing ozone-TEOS thermal chemical vapor deposition (CVD) methods, where the silicon oxide dielectric layers simultaneously possess: (1) enhanced gap filling properties; (2) enhanced bulk properties; and (3) attenuated surface sensitivity of the silicon oxide dielectic layers with respect to other microelectronics substrate layers which may include, but are not limited to, thermal silicon oxide dielectric layers formed through thermal oxidation of a silicon substrate layer.

Various methods for forming oxide isolation regions for use within integrated circuit microelectronics fabrication have been disclosed within the art of integrated circuit microelectronics fabrication.

For example, Philipossian et al., in U.S. Pat. No. 5,316, 965, discloses a method for fabricating within a semiconductor integrated circuit microelectronics fabrication a silicon oxide isolation region formed of a densified and hardened silicon oxide material which in comparison with a silicon oxide material formed employing a thermal oxidation growth method exhibits an attenuated etch rate within a hydrofluoric acid etchant. The silicon oxide isolation region so formed is formed employing a nitrogen ion implant and thermal annealing of an isolation region formed from silicon oxide material formed employing a thermal chemical vapor deposition (CVD) method.

In addition, Bose et al., in U.S. Pat. No. 5,492,858, discloses a method for forming within a shallow trench within a semiconductor integrated circuit microelectronics fabrication a shallow trench isolation region of enhanced density and limited susceptibility to dishing. The shallow trench isolation region so formed is formed employing a silicon nitride trench liner layer within the trench, so that there may be employed a steam oxidation of a silicon oxide trench filling material employed when forming the shallow trench isolation region of enhanced density and limited susceptibility to dishing.

Further, Poali et al., in U.S. Pat. No. 5,641,704, discloses a method for forming shallow trench isolation regions within shallow trenches within semiconductor integrated circuit substrates, where the shallow trench isolation regions are formed with improved dielectric and gap filling properties. The shallow trench isolation regions so formed are formed employing a trilayer dielectric structure comprising a planarizing silicon oxide dielectric layer formed interposed between two conformal silicon oxide dielectric layers.

Yet further, Kwon et al., in U.S. Pat. No. 5,665,635, discloses a method for forming within a semiconductor integrated circuit microelectronics fabrication narrow isolation regions within narrow trenches simultaneously with wide isolation regions within wide trenches while forming the narrow isolation regions and wide isolation regions with enhanced planarity. The method employs a surface treatment of the semiconductor integrated circuit microelectronics fabrication in a fashion such that a dielectric material from which is formed the narrow isolation regions and the wide isolation regions is deposited more rapidly within the narrow trenches and wide trenches than within areas adjoining the narrow trenches and wide trenches.

Finally, lang et al., in U.S. Pat. No. 5,702,977, discloses a method for forming a trench fill layer within a shallow trench within a semiconductor integrated circuit microelectronics fabrication. Analogously with Kwon et al., the method employs forming within the shallow trench an integrated circuit layer upon which may be deposited a blanket trench fill layer with a higher growth rate than upon portions of the semiconductor integrated circuit substrate other than those within the trench, but wherein the blanket trench fill layer so formed is formed to a thickness such that when chemical mechanical polish (CMP) planarized there is avoided formation of a dish within a planarized trench fill layer within the trench.

Desirable within the art of microelectronics fabrication are additional methods through which there may be formed within microelectronics fabrications silicon oxide dielectric layers while employing ozone-TEOS thermal chemical vapor deposition (CVD) methods, where the silicon oxide dielectric layers simultaneously possess: (1) enhanced gap filling properties; (2) enhanced bulk properties; and (3) attenuated surface sensitivity of the silicon oxide dielectric layers with respect to other microelectronics substrate layers which may include, but are not limited to, thermal silicon oxide dielectric layers formed through thermal oxidation of a silicon substrate layer. It is towards the foregoing goals that the present invention is directed.

SUMMARY OF THE INVENTION

A first object of the present invention is to provide a method for forming within a trench within a silicon substrate layer employed within a microelectronics fabrication a silicon oxide trench fill layer.

A second object of the present invention is to provide a method in accord with the first object of the present invention, where the silicon oxide trench fill layer is formed employing an ozone-TEOS thermal chemical vapor deposition (CVD) method while forming the silicon oxide trench fill layer with enhanced gap filling properties, enhanced bulk properties and an attenuated surface sensitivity with respect to a thermal silicon oxide layer upon which is formed the silicon oxide trench fill layer within the trench.

A third object of the present invention is to provide a method in accord with the first object of the present invention or the second object of the present invention, which method is readily commercially implemented.

In accord with the objects of the present invention, there is provided a method for forming a silicon oxide trench fill layer within a trench within a silicon substrate layer. To practice the method of the present invention, there is first provided a silicon substrate layer having a trench formed therein. There is then formed over the silicon substrate layer and filling the trench a silicon oxide trench fill layer. Finally, there is then thermally oxidized the silicon substrate layer and the silicon oxide trench fill layer within a thermal oxidation atmosphere to form a densified silicon oxide trench fill layer upon a thermal silicon oxide trench liner layer within an oxidized trench within an oxidized silicon substrate layer, where the thermal silicon oxide trench liner layer is formed from oxidation of the silicon substrate layer when forming the oxidized silicon substrate layer.

The present invention provides a method for forming within a trench within a silicon substrate employed within a microelectronics fabrication a silicon oxide trench fill layer, where the silicon oxide trench fill layer is formed employing an ozone-TEOS thermal chemical vapor deposition (CVD) method while forming the silicon oxide trench fill layer with enhanced gap filling properties, enhanced bulk properties and an attenuated surface sensitivity with respect to a thermal silicon oxide layer upon which is formed the silicon oxide trench fill layer within the trench. The method of the present invention realizes the foregoing objects by first forming the silicon oxide trench fill layer within the trench within the silicon substrate and then subsequently thermally oxidizing the silicon substrate and the silicon oxide trench fill layer to form a thermally oxidized silicon oxide trench fill layer upon a thermal silicon oxide trench liner layer within an oxidized trench within an oxidized silicon substrate. Since the thermal silicon oxide trench liner layer is formed after forming the silicon oxide trench fill layer, the silicon oxide trench fill layer is formed with attenuated surface sensitivity with respect to the thermal silicon oxide trench liner layer.

The method of the present invention is readily commercially implemented. The present invention employs methods and materials as are otherwise generally known in the art of microelectronics fabrication. Since it is the ordering of the methods and the use of specific materials which provides the method of the present invention, rather the existence of specific methods and materials which provides the method of the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a trench within a silicon substrate employed within a microelectronics fabrication a silicon oxide trench fill layer, where the silicon oxide trench fill layer is formed employing an ozone-TEOS thermal chemical vapor deposition (CVD) method, while the silicon oxide trench fill layer is formed with enhanced gap filling properties, enhanced bulk properties and an attenuated surface sensitivity with respect to a thermal silicon oxide trench liner layer upon which is formed the silicon oxide trench fill layer within the trench The method of the present invention realizes the foregoing objects by first forming the silicon oxide trench fill layer within the trench within silicon substrate and then subsequently thermally oxidizing the silicon substrate and the silicon oxide trench fill layer to form a thermally oxidized silicon oxide trench fill layer upon a thermal silicon oxide trench liner layer within an oxidized trench within an oxidized silicon substrate, where the thermal silicon oxide trench liner layer is formed when oxidizing the silicon substrate to form the oxidized silicon substrate. Since the thermal silicon oxide trench liner layer is formed after the silicon oxide trench fill layer is formed, the silicon oxide trench fill layer is formed with an attenuated surface sensitivity with respect to the thermal silicon oxide trench liner layer.

Although the method of the present invention provides substantial value when forming a silicon oxide trench fill layer upon a thermal silicon oxide trench liner layer within an isolation trench within a silicon semiconductor substrate employed within a semiconductor integrated circuit microelectronics fabrication, the method of the present invention may also be employed in forming silicon oxide trench fill layers upon thermal silicon oxide dielectric layers within trenches within silicon substrates employed within microelectronics fabrications including but not limited to semiconductor integrated circuit microelectronics fabrications, solar cell microelectronics fabrications, ceramic substrate microelectronics and flat panel display microelectronics fabrications.

Similarly, although the method of the present invention provides value when forming a silicon oxide trench fill layer upon a thermal silicon oxide trench liner layer within a trench within a silicon semiconductor substrate employed within a semiconductor integrated circuit microelectronics fabrication, a silicon oxide dielectric layer formed employing the method of the present invention need not necessarily be formed within a trench and may instead also be formed upon a flat substrate or an otherwise topographic substrate without having a trench formed therein.

Figure 1:
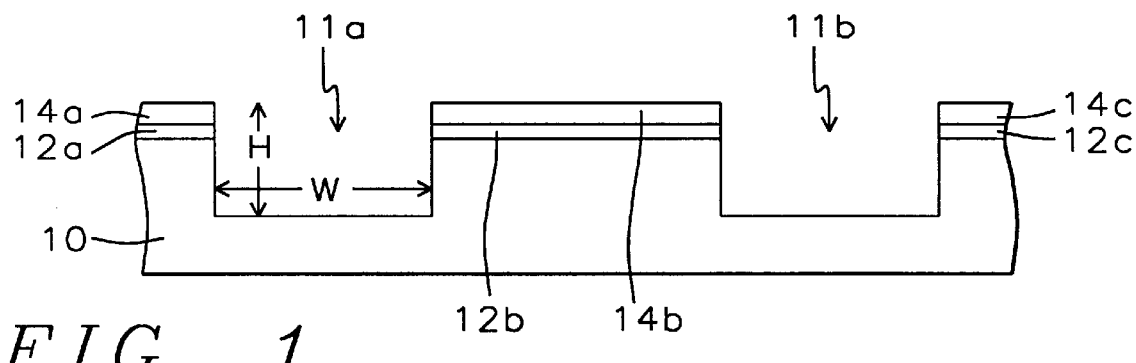
FIG. 1 to FIG. 4 show a series of schematic cross-sectional diagrams illustrating the results of forming within a trench within a silicon substrate employed within a microelectronics fabrication a patterned planarized silicon oxide trench fill layer upon a thermal silicon oxide trench liner layer in accord with a preferred embodiment of the present invention.

Referring now to FIG. 1 to FIG. 4, there is shown a series of schematic cross-sectional diagrams illustrating the results of progressive stages in forming within a microelectronics fabrication in accord with a preferred embodiment of the present invention a pair of patterned planarized silicon oxide trench fill layers within a pair of trenches within a silicon substrate in accord with the method of the present invention. Shown in FIG. 1 is a schematic cross-sectional diagram of the microelectronics fabrication at an early stage in its fabrication in accord with the method of the present invention.

Shown in FIG. 1 is a silicon substrate 10 having formed therein a pair of trenches 11a and 1b which are defined by a series of patterned pad oxide layers 12a, 12b and 12c having formed and aligned thereupon a series of patterned silicon nitride layers 14a, 14b and 14c. As illustrated within FIG. 1, each trench 11a or 11b has a height H preferably from about 3000 to about 5000 angstroms and a width W preferably greater than about 0.3 microns.

Within the preferred embodiment of the present invention, the silicon substrate 10 is preferably employed within a microelectronics fabrication selected from the group including but not limited to semiconductor integrated circuit microelectronics fabrications, solar cell microelectronics fabrications, ceramic substrate microelectronics fabrications and flat panel display microelectronics fabrications. More preferably, when the silicon substrate 10 is a silicon semiconductor substrate employed within a semiconductor integrated circuit microelectronics fabrication, the silicon semiconductor substrate is preferably a (100) silicon semiconductor substrate having an N- or P-doping, as is conventional in the art of semiconductor integrated circuit microelectronics fabrication.

With respect to the patterned pad oxide layers 12a, 12b and 12c, the patterned pad oxide layers 12a, 12b and 12c are preferably formed through patterning, employing methods as are conventional in the art of microelectronics fabrication, of a blanket pad oxide layer formed upon a precursor silicon substrate from which is formed the silicon substrate 10. The blanket pad oxide layer is preferably formed employing a thermal oxidation method at a temperature of from about 850 to about 950 degrees centigrade, where a portion of a precursor silicon substrate is thermally oxidized to form the blanket pad oxide layer. Preferably, the blanket pad oxide layer and each patterned pad oxide layer 12a, 12b or 12c within the series of patterned pad oxide layers 12a, 12b and 12c is formed to a thickness of from about 50 to about 200 angstroms.

Similarly, with respect to the series of patterned silicon nitride layers 14a, 14b and 14c, the series of patterned silicon nitride layers 14a, 14b and 14c is preferably formed through patterning, while employing methods as are conventional in the art, of a blanket silicon nitride layer formed upon the blanket pad oxide layer. The blanket silicon nitride layer may be formed employing methods including but not limited to chemical vapor deposition (CVD) methods, plasma enhanced chemical vapor deposition (PECVD) methods and physical vapor deposition PVD) sputtering methods, while employing appropriate silicon and nitrogen source materials, to form the blanket silicon nitride layer, and each of the patterned silicon nitride layers 14a, 14b and 14c, preferably of thickness about 500 to about 2000 angstroms.

Within the microelectronics fabrication whose schematic cross-sectional diagram is illustrated in FIG. 1, the series of patterned pad oxide layers 12a, 12b and 12c is typically and preferably employed for reducing thermally induced physical stress between the patterned silicon nitride layers 14a, 14b and 14c and the silicon substrate 10.

Figure 2:
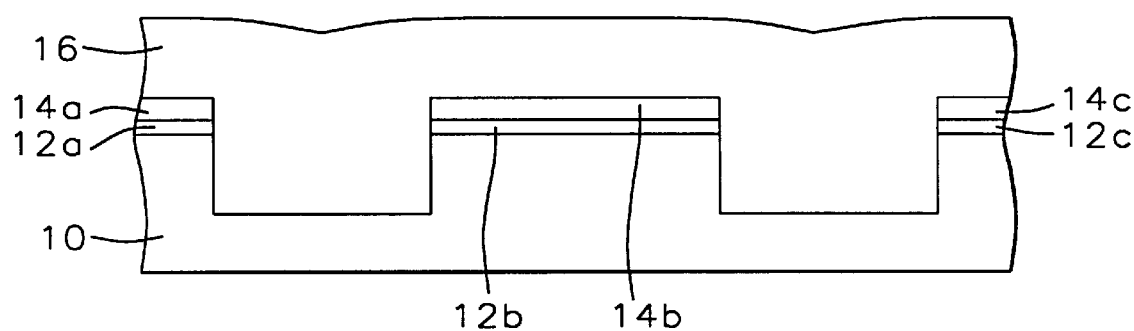

Referring now to FIG. 2, there is shown a schematic cross-sectional diagram illustrating the results of further processing of the microelectronics fabrication whose schematic cross-sectional diagram is illustrated in FIG. 1.

Shown in FIG. 2 is a schematic cross-sectional diagram of a microelectronics fabrication otherwise equivalent to the microelectronics fabrication whose schematic cross-sectional diagram is illustrated in FIG. 1, but wherein there is formed over the silicon substrate 10 and filling each of the trenches 11a and 11b a blanket silicon oxide trench fill layer 16.

Within the preferred embodiment of the present invention, the blanket silicon oxide trench fill layer 16 is preferably formed of a silicon oxide trench fill material which simultaneously possesses enhanced gap filling properties for filling the pair of trenches 11a and 11b and also has an attenuated surface sensitivity when forming the blanket silicon oxide trench fill layer 16 over the silicon substrate 10 and into the pair of trenches 11a and 11b. While there may exist several methods for forming silicon oxide dielectric layers which possess the foregoing properties, it has been found experimentally that a silicon oxide dielectric material formed employing an ozone-TEOS thermal chemical vapor deposition (CVD) method provides the blanket silicon oxide trench fill layer 16 with the desired properties. While conventional ozone-TEOS atmospheric pressure thermal chemical vapor deposition (APCVD) methods employing a reactor chamber pressure of from about 500 to about 760 torr and conventional ozone-TEOS subatmospheric pressure thermal chemical vapor deposition (SACVD) methods employing a reactor chamber pressure of from about 400 to about 600 torr may be employed for forming the blanket silicon oxide trench fill layer 16, within the preferred embodiment of the present invention there is preferably employed an ozone-TEOS thermal chemical vapor deposition (CVD) method which employs a substantially lower reactor chamber pressure, preferably in a range of from about 50 to about 100 torr. Either in conjunction with the lower reactor chamber pressure in the range of from about 50 to about 100 torr or as an alternative to the lower reactor chamber pressure in the range of from about 50 to about 100 torr, there may also be employed within the thermal chemical vapor deposition (CVD) method through which is formed the blanket silicon oxide trench fill layer 16 a generally reduced ozone:TEOS molar ratio of from about 2:1 to about 4:1 in comparison with conventional ozone-TEOS thermal chemical vapor deposition (CVD) methods which typically employ an ozone:TEOS molar ratio of from about 10:1 to about 15:1. Within the preferred embodiment of the present invention, either or both of the generally reduced reactor chamber pressure and the generally reduced ozone:TEOS molar ratio assure minimal surface sensitivity when forming the blanket silicon oxide trench fill layer 16 over the silicon substrate 10 and into the trenches 11a and 11b.

Preferably, the thermal chemical vapor deposition (CVD) method also employs: (1) a silicon substrate 10 temperature of from about 430 to about 500 degrees centigrade; (2) an ozone concentration of from about 6 to about 9 weight percent in an oxygen carrier gas flow of from about 3000 to about 6000 standard cubic centimeters per minute (sccm); and (3) a tetraethylorthosilicate (TEOS) concentration of from about 200 to about 300 milligrams per cubic meter in a helium carrier gas flow of from about 1000 to about 1400 standard cubic centimeters per minute (sccm). Preferably, the blanket silicon oxide trench fill layer 16 is formed to a thickness of from about 5000 to about 8000 angstroms.

Figure 3:
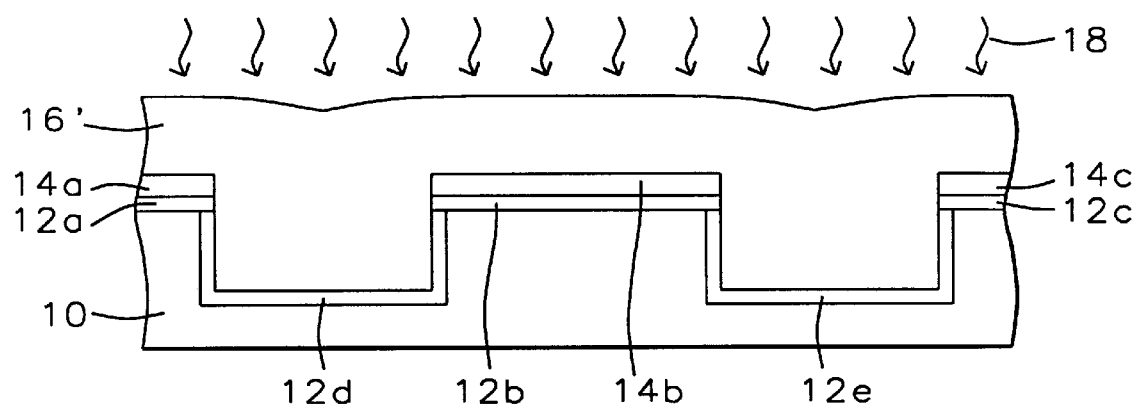

Referring now to FIG. 3, there is shown a schematic cross-sectional diagram illustrating the results of further processing of the microelectronics fabrication whose schematic cross-sectional diagram is illustrated in FIG. 2.

Shown in FIG. 3 is a schematic cross-sectional diagram of a microelectronics fabrication generally equivalent to the microelectronics fabrication whose schematic cross-sectional diagram is illustrated in FIG. 2, but wherein the microelectronics fabrication is subjected to a thermal oxidation atmosphere 18 which is employed to: (1) form from the silicon substrate 10 a thermally oxidized silicon substrate 10' having a pair of thermal silicon oxide trench liner layers 12d and 12e formed thereupon; and (2) form from the blanket silicon oxide trench fill layer 16 a blanket thermally oxidized silicon oxide trench fill layer 16'.

Within the preferred embodiment of the present invention, the thermal oxidation atmosphere 18 is formed employing a thermal oxidant selected from the group including but not limited to oxygen, ozone, nitrous oxide and nitric oxide. More preferably, the thermal oxidation atmosphere 18 employs a thermal oxidant comprising oxygen. Preferably, the thermal oxidation atmosphere 18 also employs: (1) a reactor chamber pressure of from about 600 to about 760 torr; (2) a silicon substrate 10 temperature of from about 900 to about 1200 degrees centigrade, more preferably from about 1000 to about 1100 degrees centigrade and most preferably from about 1000 to about 1050 degrees centigrade; (3) an oxygen flow rate of from about 10 to about 50 standard cubic centimeters per minute (sccm); and (4) a time period of from about 30 to about 120 minutes. More preferably, the thermal oxidation atmosphere 18 employs a silicon substrate 10 temperature of greater than about 1000 degrees centigrade for a time period of greater than about 30 minutes to form the thermal silicon oxide trench liner layers 12a and 12b each of a thickness greater than about 250 angstroms, preferably from about 300 to about 500 angstroms.

Figure 4:
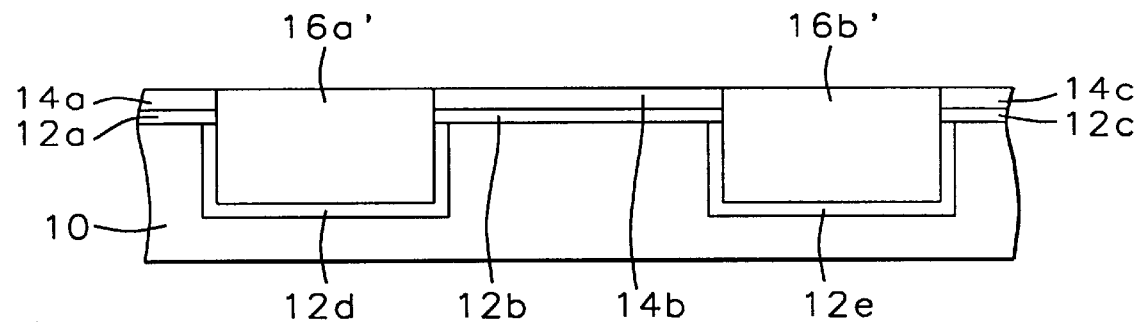

Referring now to FIG. 4, there is shown a schematic cross-sectional diagram illustrating the results of farther processing of the microelectronics fabrication whose schematic cross-sectional diagram is illustrated in FIG. 3.

Shown in FIG. 4 is a schematic cross-sectional diagram of a microelectronics fabrication otherwise equivalent to the microelectronics fabrication whose schematic cross-sectional diagram is illustrated in FIG. 3, but wherein the blanket thermally oxidized silicon oxide trench fill layer 16' has been patterned and planarized to form the patterned planarized thermally oxidized silicon oxide trench fill layers 16a' and 16b'. Although there are known in the art of microelectronics fabrication several planarizing methods which may be employed to form from the microelectronics fabrication whose schematic cross-sectional diagram is illustrated in FIG. 3 the microelectronics fabrication whose schematic cross-sectional diagram is illustrated in FIG. 4, including but not limited to chemical mechanical polish (CMP) planarizing methods and reactive ion etch (RIE) etchback planarizing methods, for the preferred embodiment of the present invention, the blanket thermally oxidized silicon oxide trench fill layer 16' is patterned and planarized to form the patterned planarized thermally oxidized silicon oxide trench fill layers 16a' and 16b' employing a chemical mechanical polish (CMP) planarizing method, which in turn employs an aqueous silica slurry, as is also conventional in the art of microelectronics fabrication As is illustrated within the schematic cross-sectional diagram of FIG. 4, the blanket thermally oxidized silicon oxide trench fill layer 16' is preferably patterned and planarized when forming the patterned planarized thermally oxidized silicon oxide trench fill layers 16a' and 16b' while employing the series of patterned silicon nitride layers 14a, 14b and 14c as a series of planarizing stop layers.

Upon forming the microelectronics fabrication whose schematic cross-sectional diagram is illustrated in FIG. 4, there is formed a microelectronics fabrication having formed therein within a pair of trenches and upon a pair of thermal silicon oxide trench liner layers a pair of patterned planarized silicon oxide trench fill layers with: (1) enhanced gap filling properties; (2) enhanced bulk properties; and (3) an attenuated surface sensitivity with respect to forming the pair of patterned planarized silicon oxide trench fill layers upon the pair of thermal silicon oxide trench liner layers.

EXAMPLES

There was formed upon a first series of silicon semiconductor substrates a corresponding series of silicon nitride layers while employing a thermal chemical vapor deposition (CVD) method which in turn employed silane as a silicon source material and ammonia as a nitrogen source material. Each silicon nitride layer within the series of silicon nitride layers so formed was formed to a thickness of about 2000 angstroms.

There was obtained a second series of silicon semiconductor substrates without having formed thereupon a corresponding series of thermal silicon nitride layers.

Upon or over each semiconductor substrate within the two series of semiconductor substrates was then formed a silicon oxide layer employing an ozone-TEOS thermal chemical vapor deposition (CVD) method, where each of the silicon oxide layers was formed to a thickness of about 5000 angstroms. The ozone-TEOS thermal chemical vapor, deposition method also employed: (1) a reactor chamber pressure of about 60 torr without plasma activation; (2) an ozone:TEOS molar ratio of about 2:1; (3) an ozone concentration of about 8 weight percent in an oxygen carrier gas flow of about 4000 standard cubic centimeters per minute (sccm); and (4) a tetraethylorthosilicate (TEOS) concentration of about 250 milligrams per cubic meter in a helium carrier gas flow of about 1200 standard cubic centimeters per minute (sccm).

The two series of semiconductor substrates were then divided into several pair of semiconductor substrates, where each pair included a first semiconductor substrate having an ozone-TEOS thermal chemical vapor deposited (CVD)) silicon oxide layer formed directly upon the first semiconductor substrate and a second semiconductor substrate having an ozone-TEOS thermal chemical vapor deposited (CVD) silicon oxide layer formed upon a silicon nitride layer formed upon the second semiconductor substrate. Each pair of semiconductor substrates within the series of pairs of semiconductor substrates was then subjected to a thermal annealing atmosphere employing one of the various conditions listed within Table I. There was then measured for each of the ozone-TEOS thermal chemical vapor deposited (CVD) silicon oxide layers a shrinkage percentage and a wet etch rate within a 50:1 dilute hydrofluoric acid solution. Shrinkage percentages were determined employing measurements as are conventional in the art of microelectronics fabrication and they are reported within Table I. Similarly, wet etch rates were determined employing elipsometric measurements as are similarly conventional in the art of microelectronics fabrication and are also reported within Table I as wet etch rate ratios with respect to a thermal silicon oxide layer formed through thermal oxidation of a silicon semiconductor substrate. Finally, there is reported within Table I for thermal oxidation of the silicon oxide dielectric layers within an oxygen thermal annealing atmosphere a thickness of a thermal silicon oxide layer formed beneath the thermally oxidized ozone-TEOS thermal chemical vapor deposited (CVD) silicon oxide layer. The thickness of the thermal silicon oxide liner layers so formed is calculated based upon a difference in percentage shrinkages between corresponding pairs of ozone-TEOS thermal chemical vapor deposited (CVD) silicon oxide dielectric layers formed upon a semiconductor substrate and formed upon a silicon nitride layer upon a semiconductor substrate, both of which are thermally oxidized within the same thermal oxidation atmosphere.

TABLE I

| Anneal Conditions | O3-TEOS on Si % Shrinkage | O3-TEOS on Si3N4 % Shrinkage | Thermal Oxide Calc. Thickness | Etch Rate Ratio |
|---|---|---|---|---|
| N2/1000 C./2 hr | 11.3% | 10.5% | | 1.53 |
| N2/1100 C./30 min | | | | 1.41 |
| N2/1100 C./2 hr | 12.0 | 11.3 | | 1.28 |
| O2/1000 C./30 min | 7.7 | 10.4 | 170A | 1.55 |
| O2/1000 C./2 hr | 3.4 | 10.6 | 470 | 1.26 |
| O2/1100 C./30 min | 8.2 | 11.1 | 180 | 1.14 |
| O2/1100 C./2 hr | 2.6 | 11.3 | 570 | 1.08 |

As is seen from review of the data in Table I, ozone-TEOS thermal chemical vapor deposited (CVD)) silicon oxide layers formed upon silicon semiconductor substrates and subsequently thermally annealed within a thermal oxidation atmosphere in accord with the preferred embodiment of the present invention show significantly reduced shrinkage in comparison with otherwise equivalent ozone-TEOS thermal chemical vapor deposited (CVD)) silicon oxide layers formed upon silicon nitride layers and subsequently thermally annealed within an equivalent thermal oxidation atmosphere. Similarly, such ozone-TEOS thermal chemical vapor deposited (CVD)) silicon oxide layers also exhibit other enhanced bulk properties, as evidenced by decreased wet etch rate within a dilute hydrofluoric acid etchant.

What is claimed is:

1. A method for forming a silicon oxide layer upon a silicon substrate comprising:

providing a silicon substrate;

forming a pad oxide layer on the silicon substrate;

forming a silicon nitride layer on the pad oxide;

etching the silicon nitride layer, pad oxide layer, and silicon substrate to form a trench through the silicon nitride and pad oxide layers and into the silicon substrate;

forming upon the silicon nitride layer a silicon oxide layer employing an ozone-TEOS chemical vapor deposition (CVD) method conducted at a pressure of from about 50 to 100 Torr; the ozone-TEOS CVD silicon oxide layer filling the trench;

thermally oxidizing the silicon substrate and the silicon oxide layer within a thermal oxidizing atmosphere to form a densified silicon oxide layer upon a silicon oxide liner layer upon an oxidized silicon substrate, where the silicon oxide liner layer is formed from oxidation of the silicon substrate when forming the oxidized silicon substrate; and planarizing the densified silicon oxide trench fill layer employing a chemical mechanical polish (CMP) planarizing method to form a patterned planarized densified silicon oxide trench fill layer upon the silicon oxide trench liner layer within the trench.

2. The method of claim 1 wherein the silicon substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

3. The method of claim 1 wherein the thermal oxidation atmosphere employs an oxidant selected from the group consisting of oxygen, ozone, nitrous oxide and nitric oxide.

4. The method of claim 1 wherein the silicon substrate and the silicon oxide trench fill layer are oxidized in the thermal oxidation atmosphere at a temperature of greater than about 1000 degrees centigrade for a time period of greater than about 30 minutes to form the silicon oxide trench liner layer of thickness at least about 250 angstroms.

5. The method of claim 1, wherein the ozone-TEOS CVD method is conducted at an ozone:TEOS molar ratio of from about 2:1 to 4:1.

6. The method of claim 1, wherein the ozone-TEOS CVD method is conducted at a pressure of from about 50 to 100 Torr and with an ozone:TEOS molar ratio of from about 2:1 to 4:1.

7. The method of claim 1, wherein the ozone-TEOS CVD method is conducted at a silicon substrate temperature of from about 430 to about 500 degrees centigrade; having an ozone concentration of from about 6 to about 9 weight percent in an oxygen carrier gas flow of from about 3000 to about 6000 sccm; and having a TEOS concentration of from about 200 to about 300 milligrams per cubic meter in a helium carrier gas flow of from about 1000 to about 1400 sccm.

8. The method of claim 1, wherein the thermal oxidation employs a thermal oxidation atmosphere containing oxygen; a reactor chamber pressure of from about 600 to 700 Torr; a silicon substrate temperature of from about 900 to 1200° C.; an oxygen flow rate of from about 10 to 50 sccm; and for a time period from about 30 to 120 minutes wherein the silicon oxide liner has a thickness greater than about 250 Å.

9. The method of claim 1, wherein the thermal oxidation employs a thermal oxidation atmosphere containing oxygen; a reactor chamber pressure of from about 600 to 700 Torr; a silicon substrate temperature of from about 1000 to 1050° C.; an oxygen flow rate of from about 10 to 50 sccm; and for a time period greater than about 30 minutes wherein the silicon oxide liner has a thickness from about 300 to 500 Å.

10. A method for forming a trench isolation region within a trench within a silicon substrate comprising:
    providing a silicon substrate; forming a pad oxide layer on the silicon substrate;
    forming a silicon nitride layer on the pad oxide;
    etching the silicon nitride layer, pad oxide layer, and silicon substrate to form a trench through the silicon nitride and pad oxide layers and into the silicon substrate;
    forming upon the silicon nitride layer and filling the trench a silicon oxide trench fill layer; the silicon oxide trench fill layer formation employing an ozone-TEOS chemical vapor deposition (CVD) method conducted at a pressure from about 50 to 100 Torr;
    thermally oxidizing the silicon substrate and the silicon oxide trench fill layer within a thermal oxidation atmosphere to form a densified silicon oxide trench fill layer upon a silicon oxide trench liner layer within an oxidized trench within an oxidized silicon substrate, where the silicon oxide trench liner layer is formed from oxidation of the silicon substrate when forming the oxidized silicon substrate; and
    planarizing the densified silicon oxide trench fill layer employing a chemical mechanical polish (CMP) planarizing method to form a patterned planarized densified silicon oxide trench fill layer upon the silicon oxide trench liner layer within the trench.

11. The method of claim 10 wherein the silicon substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

12. A method for forming a trench isolation region within a trench within a silicon substrate comprising:
    providing a silicon substrate;
    forming a pad oxide layer on the silicon substrate;
    forming a silicon nitride layer on the pad oxide;
    etching the silicon nitride layer, pad oxide layer, and silicon substrate to form a trench through the silicon nitride and pad oxide layers and into the silicon substrate;
    forming upon the silicon nitride layer and filling the trench a silicon oxide trench fill layer; the silicon oxide trench fill layer formation employing an ozone-TEOS chemical vapor deposition (CVD) method;
    thermally oxidizing the silicon substrate and the silicon oxide trench fill layer within a thermal oxidation atmosphere to form a densified silicon oxide trench fill layer upon a silicon oxide trench liner layer within an oxidized trench within an oxidized silicon substrate, where the silicon oxide trench liner layer is formed from oxidation of the silicon substrate when forming the oxidized silicon substrate; and
    planarizing the densified silicon oxide trench fill layer to form a patterned planarized densified silicon oxide trench fill layer upon the silicon oxide trench liner layer within the trench.

13. The method of claim 10 wherein the silicon substrate and the silicon oxide trench fill layer are oxidized in the thermal oxidation atmosphere at a temperature of greater than about 1000 degrees centigrade for a time period of greater than about 30 minutes to form the silicon oxide trench liner layer of thickness at least about 250 angstroms.

14. The method of claim 10, wherein the ozone-TEOS CVD method is conducted at a pressure of from about 50 to 100 Torr.

15. The method of claim 10, wherein the ozone-TEOS CVD method is conducted at an ozone:TEOS molar ratio of from about 2:1 to 4:1.

16. The method of claim 10, wherein the ozone-TOS CVD method is conducted at a pressure of from about 50 to 100 Torr and with an ozone:TEOS molar ratio of from about 2:1 to 4:1.

17. The method of claim 10, wherein the ozone-TEOS CVD method is conducted at a silicon substrate temperature of from about 430 to about 500 degrees centigrade; having an ozone concentration of from about 6 to about 9 weight percent in an oxygen carrier gas flow of from about 3000 to about 6000 sccm; and having a TEOS concentration of from about 200 to about 300 milligrams per cubic meter in a helium carrier gas flow of from about 1000 to about 1400 sccm.

18. The method of claim 10, wherein the thermal oxidation employs a thermal oxidation atmosphere containing oxygen; a reactor chamber pressure of from about 600 to 700 Torr; a silicon substrate temperature of from about 900 to 1200° C.; an oxygen flow rate of from about 10 to 50 sccm; and for a time period from about 30 to 120 minutes wherein the silicon oxide liner has a thickness greater than about 250 Å.

19. The method of claim 10, wherein the thermal oxidation employs a thermal oxidation atmosphere containing oxygen; a reactor chamber pressure of from about 600 to 700 Torr; a silicon substrate temperature of from about 1000 to 1050° C.; an oxygen flow rate of from about 10 to 50 sccm; and for a time period greater than about 30 minutes wherein the silicon oxide liner has a thickness greater from about 300 to 500 Å.

20. A method for forming a silicon oxide layer upon a silicon substrate comprising:

providing a silicon substrate;

forming a pad oxide layer on the silicon substrate;

forming a silicon nitride layer on the pad oxide;

etching the silicon nitride layer, pad oxide layer, and silicon substrate to form a trench through the silicon nitride and pad oxide layers and into the silicon substrate;

forming upon the silicon nitride layer a silicon oxide layer employing an ozone-TEOS chemical vapor deposition (CVD) method; the ozone-TEOS CVD silicon oxide layer filling the trench; the ozone-TEOS chemical vapor deposition (CVD) method being conducted at the conditions selected from the group including a reactor chamber pressure from about 50 to 100 Torr, and an ozone:TEOS molar ratio of from about 2:1 to 4:1;

thermally oxidizing the silicon substrate and the silicon oxide layer within a thermal oxidizing atmosphere to form a densified silicon oxide layer upon a silicon oxide liner layer upon an oxidized silicon substrate, where the silicon oxide liner layer is formed from oxidation of the silicon substrate when forming the oxidized silicon substrate; and planarizing the densified silicon oxide trench fill layer employing a chemical mechanical polish (CMP) planarizing method to form a patterned planarized densified silicon oxide trench fill layer upon the silicon oxide trench liner layer within the trench.

21. The method of claim 20, wherein the ozone-TEOS CVD method is conducted at a silicon substrate temperature of from about 430 to about 500 degrees centigrade; having an ozone concentration of from about 6 to about 9 weight percent in an oxygen carrier gas flow of from about 3000 to about 6000 sccm; and having a TEOS concentration of from about 200 to about 300 milligrams per cubic meter in a helium carrier gas flow of from about 1000 to about 1400 sccm.

22. The method of claim 20, wherein the thermal oxidation employs a thermal oxidation atmosphere containing oxygen; a reactor chamber pressure of from about 600 to 700 Torr; a silicon substrate temperature of from about 900 to 1200° C.; an oxygen flow rate of from about 10 to 50 sccm; and for a time period from about 30 to 120 minutes wherein the silicon oxide liner has a thickness greater than about 250 Å.

23. The method of claim 20, wherein the thermal oxidation employs a thermal oxidation atmosphere containing oxygen; a reactor chamber pressure of from about 600 to 700 Torr; a silicon substrate temperature of from about 1000 to 1050° C.; an oxygen flow rate of from about 10 to 50 sccm; and for a time period greater than about 30 minutes wherein the silicon oxide liner has a thickness from about 300 to 500 Å.

24. A method for forming a silicon oxide layer upon a silicon substrate comprising:

providing a silicon substrate;

forming a pad oxide layer on the silicon substrate;

forming a silicon nitride layer on the pad oxide;

etching the silicon nitride layer, pad oxide layer, and silicon substrate to form a trench through the silicon nitride and pad oxide layers and into the silicon substrate;

forming upon the silicon nitride layer a silicon oxide layer employing an ozone-TEOS chemical vapor deposition (CVD) method; the ozone-TEOS CVD silicon oxide layer filling the trench; the ozone-TEOS chemical vapor deposition (CVD) method being conducted at the conditions including a reactor chamber pressure from about 50 to 100 Torr, and an ozone:TEOS molar ratio of from about 2:1 to 4:1;

thermally oxidizing the silicon substrate and the silicon oxide layer within a thermal oxidizing atmosphere to form a densified silicon oxide layer upon a silicon oxide liner layer upon an oxidized silicon substrate, where the silicon oxide liner layer is formed from oxidation of the silicon substrate when forming the oxidized silicon substrate and the oxidizing atmosphere employs an oxidant selected from the group consisting of oxygen, ozone, nitrous oxide and nitric oxide; and planarizing the densified silicon oxide trench fill layer employing a chemical mechanical polish (CMP) planarizing method to form a patterned planarized densified silicon oxide trench fill layer upon the silicon oxide trench liner layer within the trench.

25. The method of claim 24, wherein the ozone-TEOS CVD method is conducted at a silicon substrate temperature of from about 430 to about 500 degrees centigrade; having an ozone concentration of from about 6 to about 9 weight percent in an oxygen carrier gas flow of from about 3000 to about 6000 scan; and having a TEOS concentration of from about 200 to about 300 milligrams per cubic meter in a helium carrier gas flow of from about 1000 to about 1400 sccm.

26. The method of claim 24, wherein the thermal oxidation employs a thermal oxidation atmosphere containing oxygen; a reactor chamber pressure of from about 600 to 700 Torr; a silicon substrate temperature of from about 900 to 1200° C.; an oxygen flow rate of from about 10 to 50 sccm; and for a time period from about 30 to 120 minutes wherein the silicon oxide liner has a thickness greater than about 250 Å.

27. The method of claim 24, wherein the thermal oxidation employs a thermal oxidation atmosphere containing oxygen; a reactor chamber pressure of from about 600 to 700 Torr; a silicon substrate temperature of from about 1000 to 1050° C.; an oxygen flow rate of from about 10 to 50 sccm; and for a time period greater than about 30 minutes wherein the silicon oxide liner has a thickness greater from about 300 to 500 Å.

* * * * *